(12) United States Patent
Itoh

(10) Patent No.: US 7,211,354 B2
(45) Date of Patent: May 1, 2007

(54) MASK SUBSTRATE AND ITS MANUFACTURING METHOD

(75) Inventor: Masamitsu Itoh, Yokohama (JP)

(73) Assignees: Kabushiki Kaisha Toshiba, Tokyo (JP); Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/372,396

(22) Filed: Feb. 25, 2003

(65) Prior Publication Data

US 2003/0184721 A1 Oct. 2, 2003

(30) Foreign Application Priority Data

Feb. 26, 2002 (JP) ............... 2002-050123

(51) Int. Cl.
*G03F 9/00* (2006.01)
*G03F 1/00* (2006.01)

(52) U.S. Cl. ............................ 430/5; 430/22

(58) Field of Classification Search .......... 430/5, 430/22, 30, 296; 356/399, 401
See application file for complete search history.

(56) References Cited

U.S. PATENT DOCUMENTS

| 5,422,206 A | * | 6/1995 | Kamon ..................... 430/5 |
| 6,084,679 A | * | 7/2000 | Steffan et al. ............. 356/401 |
| 6,514,647 B1 | * | 2/2003 | Hinogami et al. ........... 430/22 |
| 6,627,362 B2 | * | 9/2003 | Stivers et al. ............... 430/5 |
| 6,641,962 B2 | * | 11/2003 | Mizutani et al. ............. 430/22 |
| 6,899,979 B1 | * | 5/2005 | Mitsui et al. ............... 430/5 |
| 2001/0033976 A1 | * | 10/2001 | Soenosawa ................. 430/5 |

FOREIGN PATENT DOCUMENTS

| JP | 62-075532 A1 | 4/1987 |
| JP | 04-110944 A1 | 4/1992 |
| JP | 04-136855 A1 | 5/1992 |
| JP | 5-158218 | 6/1993 |
| JP | 06-078954 A1 | 11/1994 |
| JP | 07-240363 A1 | 9/1995 |
| JP | 11-267861 | 10/1999 |
| JP | 2000-155409 | 6/2000 |
| JP | 2000-347385 | 12/2000 |
| JP | 2001-033941 | 2/2001 |

OTHER PUBLICATIONS

Final Notice of Rejection Issued by Japanese Patent Office mailed Sep. 20, 2005 in Japanese application No. 2002-050123, and English translation of Notice.
Notification of Reasons for Rejection, Japanese Patent Application No. 2002-050123, Feb. 1, 2005.

* cited by examiner

*Primary Examiner*—S. Rosasco
(74) *Attorney, Agent, or Firm*—Finnegan, Henderson, Farabow, Garrett & Dunner, L.L.P.

(57) ABSTRACT

A mask substrate comprises a transparent substrate including a reference mark and a light shielding film formed on the transparent substrate.

21 Claims, 3 Drawing Sheets

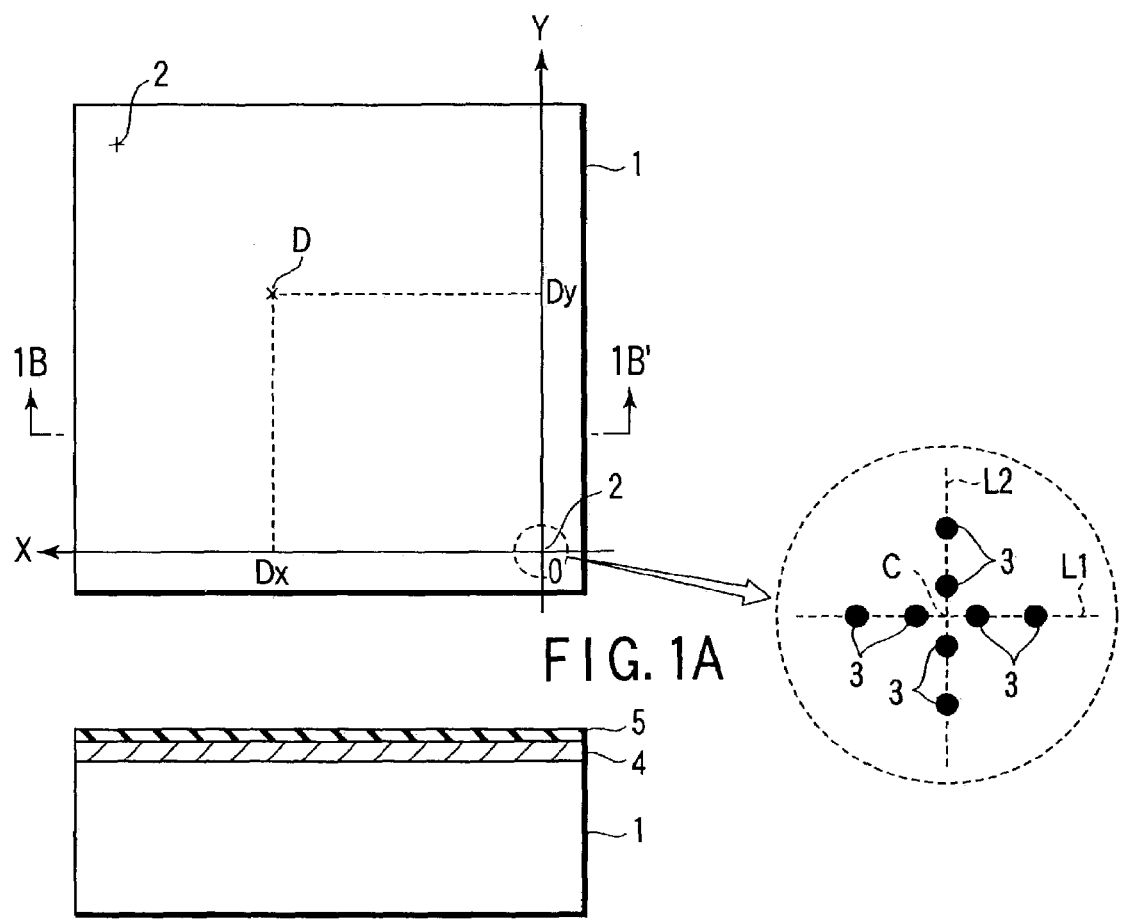
FIG. 1A
FIG. 1B
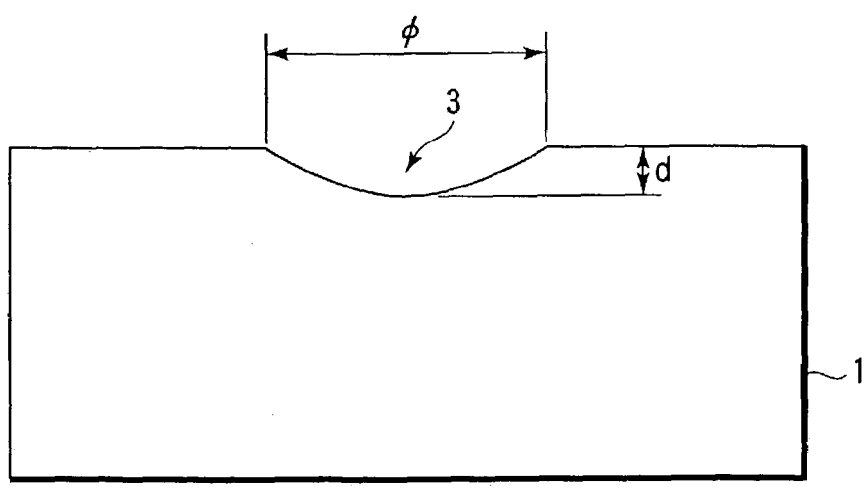
FIG. 2

_

MASK SUBSTRATE AND ITS MANUFACTURING METHOD

CROSS-REFERENCE TO RELATED APPLICATIONS

This application is based upon and claims the benefit of priority from the prior Japanese Patent Application No. 2002-050123, filed Feb. 26, 2002, the entire contents of which are incorporated herein by reference.

BACKGROUND OF THE INVENTION

1. Field of the Invention

The present invention relates to a mask substrate such as a mask blank or a photo mask and its manufacturing method.

2. Description of the Related Art

As semiconductor devices have become finer, it has been desirable to allow a photolithography step to deal with these finer semiconductor devices. The device design rule has already specified a design rule of 0.13 µm. In this case, pattern size accuracy to be controlled is about 10 nm and is thus very demanding.

Since such a very tight accuracy is required, problems with the photolithography step used in a semiconductor manufacturing process are becoming noticeable. One of these problems is a defect in a photo mask substrate (photo mask) on which a pattern is formed and which is used for the photolithography step. This problem will further be described below.

The photo mask is required to have substantially no defects. Thus, a defect inspecting apparatus is used to inspect the photo mask so that a defect found through the inspection can be repaired.

However, such defect inspection and repair require much expense and time. This is one of the major factor that sharply increases the price of the photo mask. Furthermore, only fine defects can be repaired. If there is any defect that significantly disturbs a pattern, a photo mask must be reproduced. This is another factor that sharply increases the price of the photo mask.

Many of such defects found during a process of manufacturing a photo mask are caused by a contaminant already present on the photo mask substrate (mask blank) before a pattern is formed.

BRIEF SUMMARY OF THE INVENTION

A mask substrate according to an aspect of the present invention comprises a transparent substrate including a reference mark and a light shielding film formed on the transparent substrate.

A method of mask substrate according to an aspect of the present invention comprises irradiating a surface of a transparent substrate with an energy beam and forming a reference mark including a concave in the front surface of the transparent substrate; and forming a light shielding film on the surface of the transparent substrate.

A method of mask substrate according to another aspect of the present invention comprises forming a light shielding film on a transparent substrate; and processing the light shielding film to form a reference mark.

BRIEF DESCRIPTION OF THE SEVERAL VIEWS OF THE DRAWING

FIGS. 1A and 1B are a plan view and a sectional view showing a mask blank according to an embodiment of the present invention;

FIG. 2 is a sectional view showing a concave as a reference position mark on the mask blank according to the embodiment of the present invention;

DETAILED DESCRIPTION OF THE INVENTION

Figure 3:
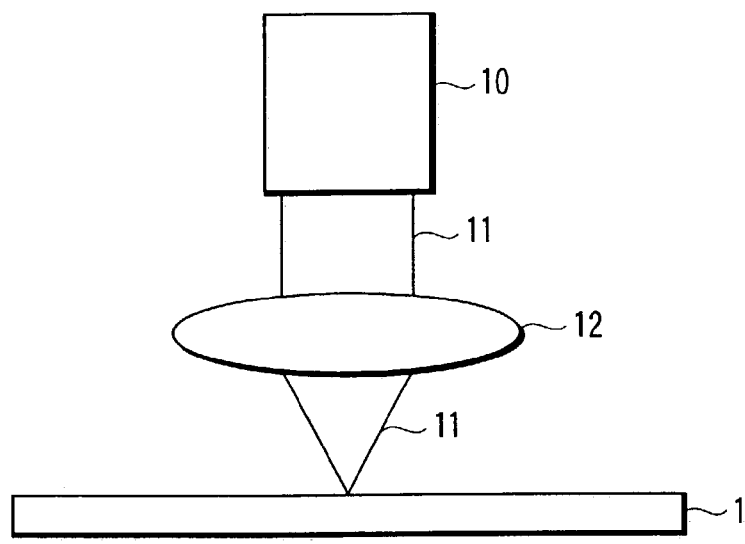
FIG. 3 is a schematic view showing a laser apparatus used to form the concave as the reference position mark on the mask blank according to the embodiment of the present invention.

An embodiment of the present invention will be described below with reference to the drawings.

FIGS. 1A and 1B are a plan view and a sectional view showing a mask blank according to an embodiment of the present invention.

In these figures, reference numeral 1 denotes a quartz substrate (glass substrate). Two reference position marks 2 are formed on a front surface of the quartz substrate 1. These reference position marks 2 are formed in two obliquely opposite corners on the front surface of the quartz substrate 1. The quartz substrate 1 has a thickness of, for example, 6.25 mm. The quartz substrate 1 (transparent substrate) is such a substrate that allows exposure light to pass through. The quartz substrate 1 is transparent to the light.

By forming the reference position marks 2 at the two positions on the front surface of the quartz substrate, an X-Y coordinate system can be defined, for example, as shown in FIG. 1A. Then, the position of a defect D (Dx, Dy) can be precisely determined.

Specifically, the X-Y coordinate system can be determined by defining a square having the two reference position marks 2 as vertexes. Then, by setting one of the reference position marks as an origin (0,0), the position of the defect D can be represented by X-Y coordinates.

The X-Y coordinate system is rectangular but need not necessarily be rectangular. Further, the origin of the coordinates is not limited to the position shown in FIG. 1A. For example, the center of the quartz substrate may be the origin.

The reference position marks 2 are each comprised of eight concaves that is, concave features, 3 arranged in cross form. Each of the concaves 3 is, for example, a recess having diameter $\phi$ of about 100 µm and a depth d of about 3 µm as shown in FIG. 2. A pitch of the concaves is 200 µm. The mark references point (origin (0, 0)) is the intersection C between a line L1 defined by the horizontally arranged four concaves 3 and a line L2 defined by the vertically defined four concaves 3.

A light shielding film 4 is formed on the front surface of the quartz substrate 1 as shown in FIG. 1B. The light shielding film 4 is, for example, a Cr film having a thickness of 70 nm. An anti-reflection film 5 is formed on the light shielding film 4. The anti-reflection film 5 ism for example, a chromium oxide film having a thickness of 30 nm. The total thickness of the light shielding film 4 and anti-reflection film 5 is, for example, about 3 µm. This prevents the concave 3 from being filled with the light shielding film 4 and the anti-reflection film 5, that is, the light shielding film also includes concave features.

That is, the functions of the reference position marks are not lost even with the formation of the light shielding film 4 and the anti-reflection film 5. Although in this embodiment, the concave 3 has a depth of about 3 µm, the depth is generally about several µm. The total thickness of the light shielding film 4 and anti-reflection film 5 is generally set at such a value that the concaves 3 are not filled with these films.

In this regard, even if the concaves 3 are filled with the light shielding film 4 and the anti-reflection film 5, provided that concaves corresponding to the underlying concaves 3 are formed in the surfaces of the light shielding film 4 and anti-reflection film 5, it is possible to use, as reference marks, the concaves comprised of the light shielding film 4 or the concaves comprised of a stacked layer of the light shielding film 4 and anti-reflection film 5.

A mask blank configured as described above can be obtained, for example, by the manufacturing method described below.

First, a quartz substrate 1 of a 152×152 mm square the front and back surfaces of which have been polished is washed to clean its front surface, on which the light shielding film 4 and anti-reflection film 5 of the quartz substrate 1 are to be formed.

Then, as shown in FIG. 3, a well-known YAG laser apparatus is used to irradiate the front surface of the quartz substrate 1 with a beam 11 from a YAG laser (hereinafter simply referred to as a "laser beam") to form concaves.

More specifically, the laser beams emitted by the YAG laser main body 10 are condensed by a condensing optical system 12 so as to have a diameter of 10 µm. The front surface of the quartz substrate 1 is irradiated with the condensed laser beam 11 to form concaves. At this time, eight areas of the front surface of the quartz substrate are irradiated with the laser beam 11 by moving the quartz substrate 1 or the YAG laser main body 10. It is generally easier to move the quartz substrate 1.

In this case, the concaves are formed because the quartz substrate 1 is melted and evaporated in the areas irradiated with the laser beam 11. Since the quartz substrate 1 is evaporated in the areas irradiated with the laser beam 11 to become a gas, broken pieces of the quartz substrate 1 (pieces of quartz) are not splash about from the areas irradiated with the laser beam 11. Accordingly, no new defects occur during the step of forming the reference position marks 2.

Further, the thickness of the quartz substrate 1 is, for example, 6.25 mm as described above. When concaves are formed by application of the laser beam 11, such a thickness prevents through-holes from being formed in the quartz substrate 1 even if an error occurs in the irradiation.

Figure 4:
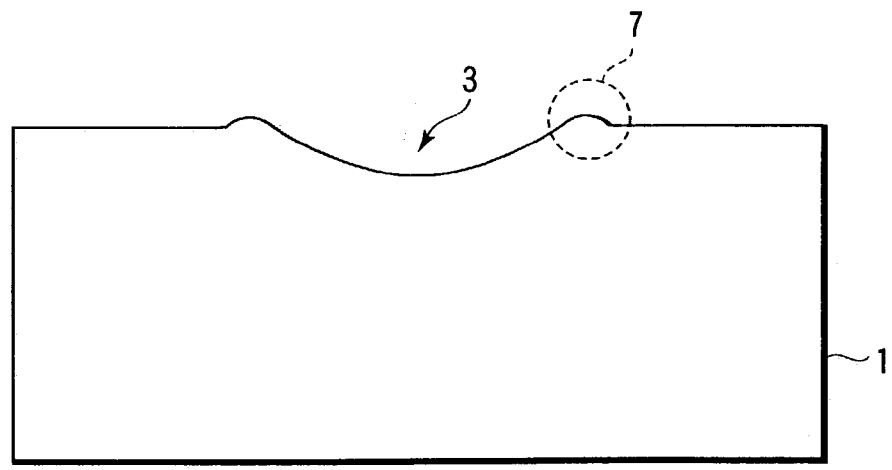
FIG. 4 is a sectional view showing a concave formed by the laser apparatus.

The concaves 3 obtained by application of the laser beam 11 are each shaped so that its edge portion 7 is angularly raised as shown in FIG. 4. Accordingly, the edge portion 7 is flattened by a CMP (Chemical Mechanical Polishing) process.

FIG. 2 shows that the edge portion 7 in FIG. 4 has been completely flattened. However, it is difficult to perfectly remove the angularly raised portion. As a result, actually, part of the angularly raised portion remains. Thus, whether or not the concave 3 has been obtained by application of the laser beam 11 (application of an energy beam) is determined depending on the presence of raised shape of the edge portion 7 of the concave 3.

The concave 3 has, for example, a diameter of about 100 µm and a depth of about 3 µm as described above. The concave 3 is thus wide and shallow. This shape prevents dust from being collected in the concave 3.

The diameter and depth of the concave 3 can generally be controlled, for example, by the wavelength, energy (output), beam diameter, or the like of the laser. In the present embodiment, for example, the concave 3 of the above described size can be formed by applying the laser beam 11, for example, at a wavelength of 266 µm (quadruple harmonics of the YAG laser) and an applied energy of 20 J/cm$^2$.

Subsequently, as shown in FIG. 1B, for example, Cr is deposited on the quartz substrate 1 to a thickness of 70 nm by a sputtering method to form the light shielding film 4. Subsequently, for example, chromium oxide is deposited on the light shielding film 4 to a thickness of 30 nm by the sputtering method to form the anti-reflection film 5. If required, a resist film is coated on the film 5. Thus, a mask blank is completed.

The reference position marks 2 thus obtained can be detected by a conventional surface contamination inspecting apparatus. It has been confirmed that the two reference position marks 2 can be detected using, for example, the surface contamination inspecting apparatus M1320 manufactured by LASERTECH CORPORATION. In this case, the reproducibility of detection of the positions of the reference position marks 2 is 1 µm or less.

Thus, according to the present embodiment, the position of a defect in the mask blank can be precisely determined. This enables an area free from defects to be selected as a pattern formed area. Thus, a mask blank with a defect can be effectively utilized to improve productivity.

Figure 5:
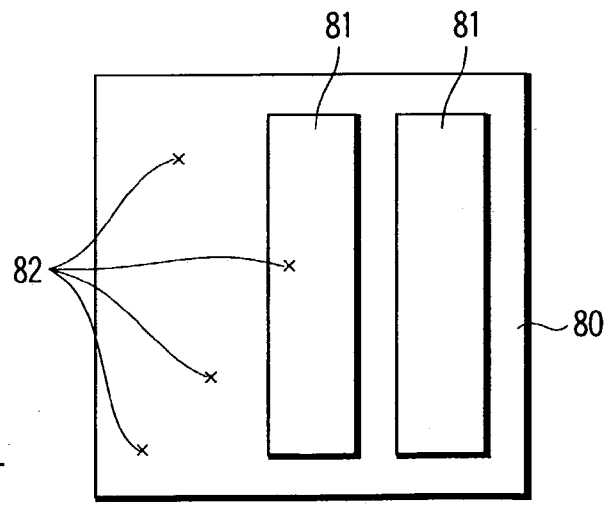
FIG. 5 is a plan view showing a conventional mask blank.

In contrast, the conventional mask blank has no reference position marks. Accordingly, although a defect inspection can be executed on the conventional mask blank, it is difficult to precisely determine the position of a defect. As a result, the defect D may be contained in a pattern formed area 81 on a mask blank 80 as shown in FIG. 5.

Further, the mask blank (with the reference position marks 2) of the present embodiment and the conventional mask blank (without any reference position marks 2) were inspected for surface contamination.

The results of the inspection indicate that there are no differences in the number of defects between the mask blank of the present embodiment and the conventional mask blank. Thus, it has been confirmed that the number of defects does not increase even with the formation of the reference position marks 2. That is, it has been confirmed that no new defects occur during the step of forming the reference position marks 2.

Figure 6A:
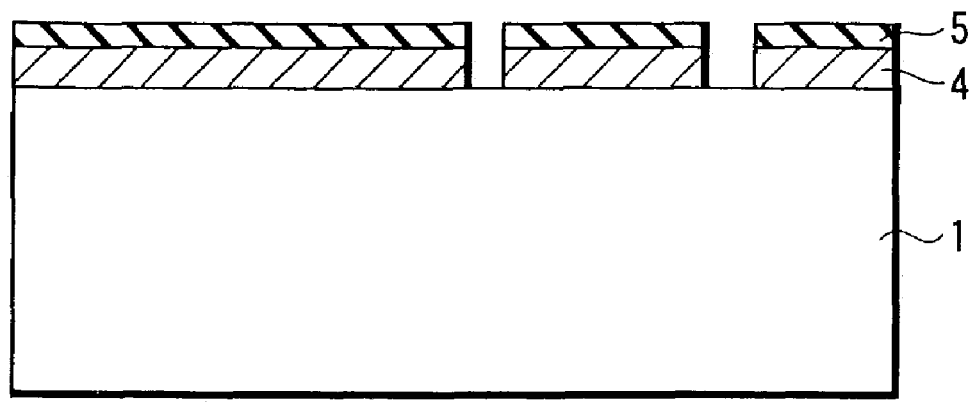
FIGS. 6A and 6B are a sectional view and a plan view illustrating a process of forming the photo mask according to the embodiment of the present invention.
Figure 6B:
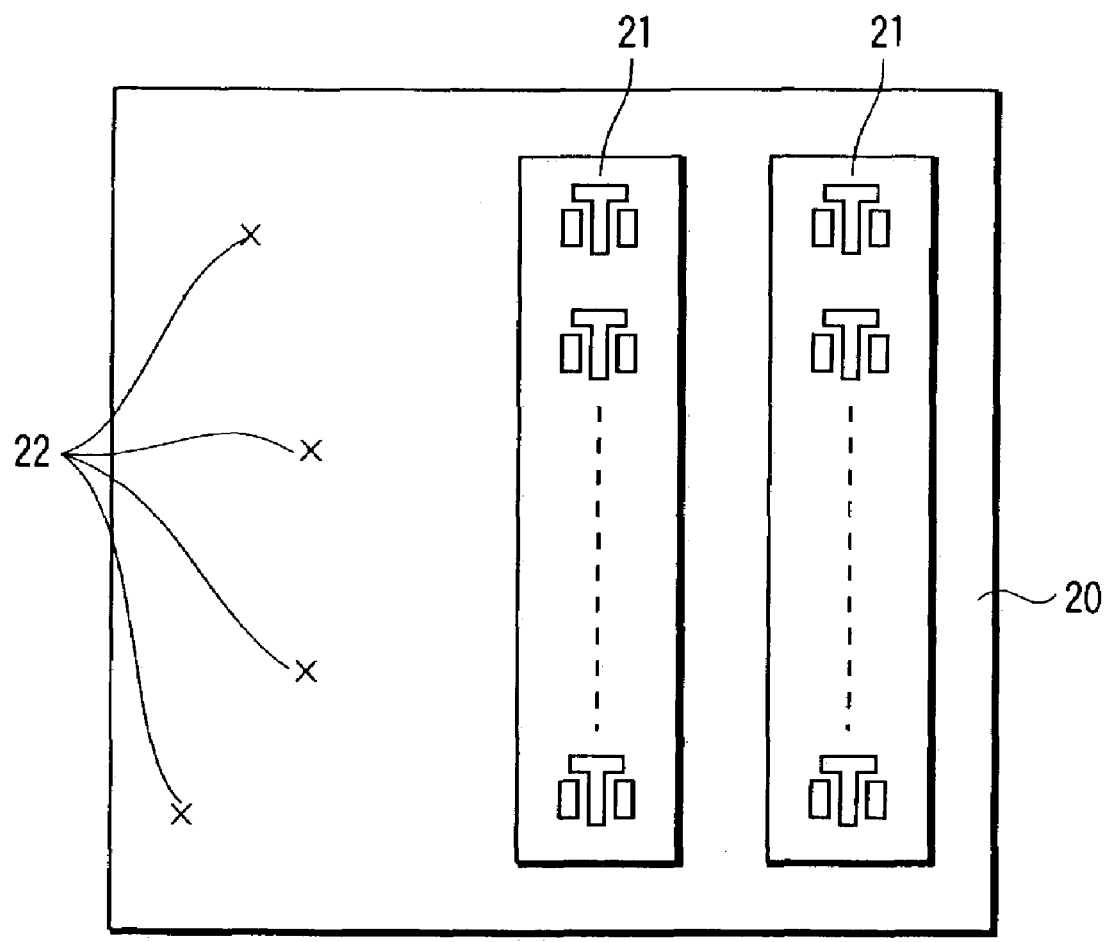

Completion of the mask blank is followed by a step of producing a photo mask. Specifically, as shown in FIG. 6A, the light shielding film 4 and the anti-reflection film 5 are processed using well-known photolithography and etching. Then, as shown in FIG. 6B, a device pattern such as an LSI pattern is formed in the pattern formed area 21, which is free from the defect, on the mask blank 20. FIG. 6B shows a pattern (a gate, source, and drain pattern) of a MOS transistor as the device pattern.

In this case, the mask blank and the photo mask are commonly produced by different manufacturers. The mask blank manufacturer delivers the mask blank and information including the defect position (defect position information) to the photo mask manufacturer.

However, there are various methods of delivering defect position information. For example, the defect position information may be delivered in the form of paper, a storage medium, or the like simultaneously with the delivery of the mask blank. Alternatively, the defect position information may be delivered using an information transmitting medium such as the internet separately from the delivery of the mask blank.

The present invention is not limited to the present embodiment, described above. For example, the film formed on the quartz substrate 1 is not limited to the chromium film. For example, this film may be a halftone film comprised of molybdenum silicide or the like. Further, the positions and number, shape, and size of reference marks are not limited to those in the above embodiment. They may be properly changed depending on the inspecting apparatus used or purposes.

Further, the laser is not limited to the YAG laser. A carbon dioxide gas laser (wavelength: 10.6 µm) or a $F^2$ laser can also be used. If a laser having a shorter wavelength than the $F^2$ laser is used, a calcium fluoride substrate is preferably used in place of the quartz substrate 1. This is because the calcium fluoride substrate more efficiently absorbs a laser beam with a shorter wavelength, thus allowing the concaves 3 to be formed easily in the substrate.

Further, in the present embodiment, the reference position mark 2 is comprised of the eight concaves 3 arranged in cross form.

However, the number of concaves 3 may be at least seven or at most nine. In general, an increase in the number of concaves 3 increases the accuracy with which the mark reference point (the intersection C between the lines L1 and L2) is detected. This will be described below in detail.

As described above, with the two reference position marks 2, the X-Y coordinate system can be defined by assuming a square using these marks as vertexes. In this case, if one reference position mark 2 is defined using one concave 3, an error in the detection of position of the concave 3 is reflected directly in the accuracy with which the reference position mark 2 is detected. The detection error results from a difference in the shape of the concave 3, an error in a measuring mechanism, or the like.

In contrast, one reference position mark 2 is defined using the plurality of concaves 3 arranged in cross form, and the line L1 is determined, by linear regression (interpolation process), from the positions of the plurality of vertically arranged concaves 3. Likewise, the line L2 is determined, by linear regression, from the positions of the plurality of horizontally arranged concaves 3. Then, as the number of the plurality of concaves 3 increases, the adverse effects of an error in the detection of positions of the individual concaves 3 weaken. Thus, the interpolation becomes more accurate. Consequently, the horizontal line L1 and the vertical line L2 can be determined more precisely. Furthermore, the intersection between the horizontal line L1 and the vertical line L2 can be determined more precisely than the mark reference point (origin).

Although well known, the linear regression will be described in brief. The line L1, determined from the plurality of horizontally arranged concaves 3, is selected so that the sum of the distances from the line L1 to the respective concaves 3 is minimum.

Further, in the present embodiment, the reference position marks are formed on the front surface of the quartz substrate 1. However, the reference position marks may be formed by processing the light shielding film or both light shielding film and anti-reflection film. Such reference marks can be formed by a method using a well-known pattern forming process including application of photosensitive material (resist), exposure of the resist, development of the resist, etching of the film or the films, and the like. An increase in the number of steps can be prevented by executing the step of forming reference position marks simultaneously with a step of forming a device pattern such as an LSI pattern on the light shielding film.

However, a new defect may occur during the step of forming reference position marks. Thus, in this regard, the photo mask substrate with the reference position marks 2 according to the present embodiment is more preferable. Furthermore, rather than processing the transparent substrate or the light shielding film to form reference position marks, it is possible to introduce a member separate from the light shielding film and the transparent substrate to form reference position marks from this member.

Further, in the description of the above embodiment, the mask blank or the photo mask includes the plurality of reference marks. However, the mask blank or the photo mask may include only one reference mark. To precisely determine the position of a defect, a plurality of reference marks are preferably used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask substrate comprising:
   a transparent substrate including a reference mark for determining a position of a defect on the transparent substrate;
   a light shielding film provided on the transparent substrate; and
   an anti-reflective film provided on the light shielding film.

2. The mask substrate according to claim 1, wherein the reference mark includes a concave provided in a surface of the transparent substrate.

3. The mask substrate according to claim 2, wherein the concave is formed by irradiating the surface of the transparent substrate with an energy beam.

4. The mask substrate according to claim 2, wherein the concave is formed in a corner of the transparent substrate.

5. The mask substrate according to claim 2, wherein an edge of the concave includes a raised shape portion.

6. The mask substrate according to claim 1, wherein the reference mark includes a plurality of concaves formed in a surface of the transparent substrate, and the plurality of concaves are arranged in cross form.

7. The mask substrate according to claim 1, wherein the reference mark includes a part of the light shielding film.

8. The mask substrate according to claim 1, wherein the reference mark includes a concave feature formed in the light shielding film.

9. The mask substrate according to claim 8, wherein the concave is formed in a corner of the transparent substrate.

10. The mask substrate according to claim 1, wherein the transparent substrate further includes a plurality of reference marks.

11. The mask substrate according to claim 10, wherein each of the plurality of reference marks includes at least one concave.

12. The mask substrate according to claim 11, wherein the at least one concave is provided in a corner of the transparent substrate.

13. The mask substrate according to claim 1, wherein the transparent substrate comprises quartz or calcium fluoride.

14. The mask substrate according to claim 1, wherein the light shielding film includes an LSI pattern.

15. A method of manufacturing a mask substrate comprising:

irradiating a surface of a transparent substrate with an energy beam and forming a reference mark for determining a position of a defect on the transparent substrate, the reference mark including a concave feature in the surface of the transparent substrate;

forming a light shielding film on the surface of the transparent substrate; and forming an anti-reflective film on the light shielding film.

16. The method of manufacturing a mask substrate according to claim 15, wherein the energy beam is a laser beam.

17. The method of manufacturing a mask substrate according to claim 15, further comprising polishing a surface including the concave after the concave have been formed in the surface of the transparent substrate and before the light shielding film is formed.

18. The method of manufacturing a mask substrate according to claim 15, further comprising processing the light shielding film to form an LSI pattern.

19. A method of manufacturing a mask substrate comprising:

forming a light shielding film on a transparent substrate;

forming an anti-reflective film on the light shielding film;

and processing the light shielding film to form a reference mark for determining a position of a defect on the transparent substrate.

20. The method of manufacturing a mask substrate according to claim 19, further comprising processing the light shielding film to form at least one reference mark.

21. The method of manufacturing a mask substrate according to claim 19, further comprising processing the light shielding film to form an LSI pattern.

* * * * *